United States Patent
Shirai et al.

(10) Patent No.: US 12,249,633 B2
(45) Date of Patent: Mar. 11, 2025

(54) FIELD-EFFECT TRANSISTOR AND METHOD FOR MANUFACTURING FIELD-EFFECT TRANSISTOR

(71) Applicant: WILL SEMICONDUCTOR (SHANGHAI) CO. LTD., Shanghai (CN)

(72) Inventors: Nobuyuki Shirai, Yokohama (JP); Nobuyoshi Matsuura, Yokohama (JP)

(73) Assignee: WILL SEMICONDUCTOR (SHANGHAI) CO. LTD., Shanghai (CN)

( * ) Notice: Subject to any disclaimer, the term of this patent is extended or adjusted under 35 U.S.C. 154(b) by 525 days.

(21) Appl. No.: 17/667,641

(22) Filed: Feb. 9, 2022

(65) Prior Publication Data

US 2023/0079309 A1    Mar. 16, 2023

(30) Foreign Application Priority Data

Sep. 16, 2021    (JP) .................. 2021-151414

(51) Int. Cl.
*H01L 29/78* (2006.01)
*H01L 29/423* (2006.01)
*H01L 29/66* (2006.01)

(52) U.S. Cl.
CPC .... *H01L 29/4236* (2013.01); *H01L 29/66734* (2013.01); *H01L 29/7813* (2013.01)

(58) Field of Classification Search
CPC .. H01L 29/7813; H01L 29/41; H01L 29/4236
See application file for complete search history.

(56) References Cited

U.S. PATENT DOCUMENTS

| | | | |
|---|---|---|---|
| 6,404,007 B1* | 6/2002 | Mo | H01L 21/28202 257/332 |
| 2011/0049618 A1 | 3/2011 | Lee et al. | |
| 2013/0069147 A1* | 3/2013 | Ohta | H01L 29/66734 438/270 |
| 2016/0300914 A1* | 10/2016 | Sedlmaier | H01L 29/66734 |
| 2019/0103489 A1* | 4/2019 | Hsu | H01L 29/7813 |
| 2020/0227526 A1* | 7/2020 | Li | H01L 21/32133 |

FOREIGN PATENT DOCUMENTS

| | | |
|---|---|---|
| JP | 2009-505403 A | 2/2009 |
| JP | 2010-537428 A | 12/2010 |
| JP | 5075823 B2 | 11/2012 |
| WO | WO-2007/021701 A2 | 2/2007 |
| WO | WO-2009/026174 A1 | 2/2009 |

* cited by examiner

*Primary Examiner* — Walter H Swanson
*Assistant Examiner* — Jacob T Nelson
(74) *Attorney, Agent, or Firm* — MUNCY, GEISSLER, OLDS & LOWE, P.C.

(57) ABSTRACT

A problem to be solved is to reduce a leakage current between the gate and the source. Provided is a trench type FFT, where a thickness Δ1 of an oxide insulating layer O1 that is closer to the inner side than a line extending upward from the outer peripheral side of a nitride insulating layer N is ½ of a thickness d of the nitride insulating layer N or more; and a thickness Δ2 of an oxide insulating layer O3 between the upper end of the nitride insulating layer N and a gate region is ½ of the thickness d of the nitride insulating layer N or more.

4 Claims, 14 Drawing Sheets

FIG. 3D after removal of oxide
insulating layer

FIG. 4A after removal of nitride
insulating layer enlarged view (after removal of
nitride insulating layer)

FIG. 4B after deposition of oxide insulating layer

FIELD-EFFECT TRANSISTOR AND METHOD FOR MANUFACTURING FIELD-EFFECT TRANSISTOR

BACKGROUND OF THE INVENTION

1. Field of the Invention

The disclosure relates to a field-effect transistor, particularly a shield gate trench type FET.

2. Description of the Related Art

Conventionally, a field-effect transistor (FET) has been widely used as a power transistor, and one example may be a shield gate trench type FET. Note that, the FET is normally a metal-oxide-semiconductor field-effect transistor (MOSFET).

The shield gate trench type FET is a type of vertical trench type FET in which a gate region (gate electrode) is disposed inside a trench formed in a semiconductor substrate, and in the shield gate trench type FET, a shield gate region (shield gate electrode) different from the gate region is arranged inside the trench.

Compared with a normal trench type FET, the shield gate trench type FET has merits such as being capable of reducing on-resistance between the drain and the source, being capable of reducing capacitance between the gate and the gate-drain, and the like (see Literature of related art 1).

Here, in the shield gate trench type FET, a thermal oxide insulating layer is usually formed on the inner wall of the trench as an oxide insulating layer ($SiO_2$: hereinafter, also referred to as SiO2 or silicon oxide) on the inner side of the trench. Besides, it is proposed that in this case, in order to suppress the growth of the thermal oxide insulating layer in a subsequent process, a nitride insulating layer (SiN: hereinafter, also referred to as silicon nitride) is formed on the inner side of the thermal oxide insulating layer (see Patent literature 2).

LITERATURE OF RELATED ART

Patent Literature

[Patent literature 1] National Publication of International Patent Application No. 2009-505403
[Patent literature 2] Japanese Patent Laid-Open No. 2010-537428

SUMMARY OF THE INVENTION

Here, in the shield gate trench type FET, after a shield gate region is formed inside the oxide insulating layer at a lower part inside the trench, a gate region is formed with a relatively thick oxide insulating layer interposed above the shield gate region. Note that, the oxide insulating layer between the gate and the shield gate is referred to as an inter-poly oxide insulating layer (IPO) because the gate region and the shield gate region are normally formed by polysilicon.

The gate region is formed in a state that the oxide insulating layer above the shield gate region inside the trench is removed, then a nitride insulating layer at an upper part inside the trench is removed, and an oxide layer on the inner wall of the trench is exposed. Because the nitride insulating layer is reliably removed, the upper end of the nitride insulating layer is located lower than the upper surface of the surrounding oxide insulating layer, and a recessed part is generated on the surface of the oxide insulating layer.

After the nitride insulating layer at the upper part is removed, oxides are deposited by, for example, chemical vapor deposition (CVD) to adjust the layer thickness of the oxide insulating layer on the side of the gate, but sometimes the recessed part generated along with the removal of the nitride insulating layer may not be sufficiently filled with an oxide insulating layer formed by CVD, and the recessed part may remain here. After the oxide insulating layer is formed by CVD, a gate region is formed in an upper space inside the trench, but the recessed part remaining after the removal of the nitride insulating layer described above becomes a protrusion part of the gate region. When there is a protrusion in the gate region, an electric field is likely to be concentrated here, and there is a possibility that a leakage current between the gate and the source may increase.

The disclosure is a field-effect transistor, having: a trench, which is formed in a semiconductor substrate; an oxide insulating layer, which is accommodated inside the trench; a shield gate region, which is disposed at a lower part in the oxide insulating layer; a gate region, which is disposed above the shield gate region in the oxide insulating layer with an interval therebetween; and a nitride insulating layer, which is disposed in a way of covering the bottom and the surrounding of the lateral side of the shield gate region in the oxide insulating layer with an interval therebetween. A thickness of the oxide insulating layer that is closer to the inner side than a line extending upward from the outer peripheral side of the nitride insulating layer is ½ of a thickness of the nitride insulating layer or more; or a thickness of the oxide insulating layer between the upper end of the nitride insulating layer and the gate region is ½ of the thickness of the nitride insulating layer or more.

In addition, the disclosure is a field-effect transistor, having: a trench, which is formed in a semiconductor substrate; an oxide insulating layer, which is accommodated inside the trench; a shield gate region, which is disposed at a lower part in the oxide insulating layer; a gate region, which is disposed above the shield gate region in the oxide insulating layer with an interval therebetween; and a nitride insulating layer, which is disposed in a way of covering the bottom and the surrounding of the lateral side of the shield gate region in the oxide insulating layer with an interval therebetween. A thickness of the oxide insulating layer between the upper end of the nitride insulating layer and the gate region is equal to or greater than a predetermined thickness, and the surface of the oxide insulating layer above the upper end of the nitride insulating layer has a convex shape.

The disclosure is a method for manufacturing a field-effect transistor, in which a trench is formed in a semiconductor substrate; a first oxide insulating layer is deposited inside the trench; a nitride insulating layer is deposited on the first oxide insulating layer; a second oxide insulating layer is deposited on the nitride insulating layer; a shield gate region is formed on the inner side of the second oxide insulating layer and at the lower part inside the trench; an intermediate insulating layer is deposited above the shield gate region; at an upper part inside the trench, the second oxide insulating layer is removed to expose the nitride insulating layer; the nitride insulating layer at the upper part inside the trench is removed, and a recessed part generated from the removal of the nitride insulating layer and having a width corresponding to a thickness of the nitride insulating layer is formed between the intermediate insulating layer and the first oxide insulating layer; a third oxide insulating layer is deposited on the first oxide insulating layer and the intermediate insulating layer that are exposed by removing the nitride insulating layer, and at this time, a thickness with which the third oxide insulating layer is formed is made to be ½ of the thickness of the nitride insulating layer or more, thereby filling the recessed part and making the surface of the part into a plane or have a shape that is convex upwards; and a gate region is formed on the inner side of the oxide insulating layer and at the upper part of the trench.

According to the disclosure, the recessed part generated along with the removal of the nitride insulating layer can be filled, and the electric field can be avoided from being concentrated on the gate region.

PREFERRED EMBODIMENT OF THE PRESENT INVENTION

Hereinafter, an embodiment according to the disclosure is described with reference to the drawings. It should be noted that the disclosure is not limited to the embodiment described herein.

[Configuration of Shield Gate Trench Type FET]

Figure 1:
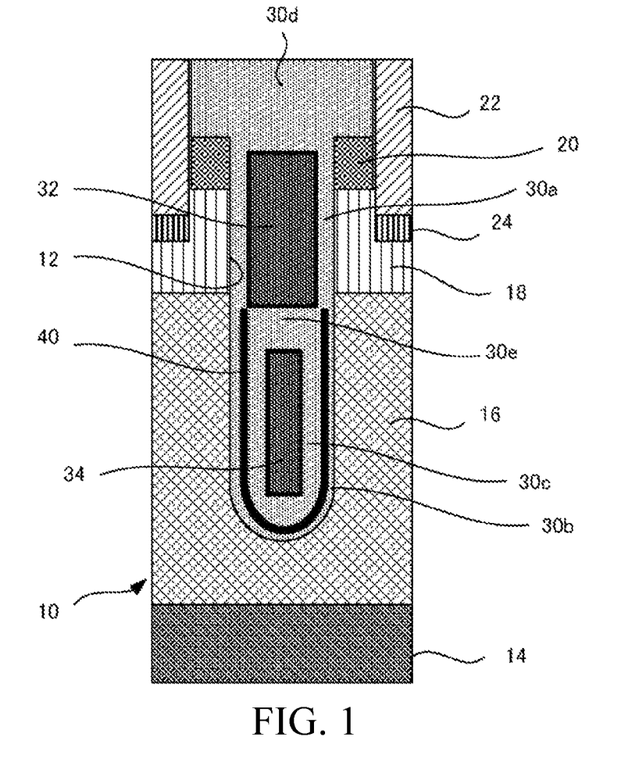
FIG. 1 is a diagram schematically showing a structure of a field-effect transistor (shield gate trench type FET (n channel)) according to the embodiment.

FIG. 1 is a diagram schematically showing a structure of a field-effect transistor (shield gate trench type FET (n channel)) according to the embodiment.

In a semiconductor substrate 10, a trench 12 having a vertical hole shape is formed inward from the surface thereof. In the embodiment, the semiconductor substrate 10 is a silicon (Si) substrate.

A drain region 14 which is an n+ region is formed on the back surface side of the semiconductor substrate 10, and an n region 16 is formed above the drain region 14. In this example, a lower part of the trench 12 extends from the surface side into the n region 16. Alternatively, the lower part of the trench 12 may reach a boundary between the n region 16 and an n+ region 20.

A p region 18 is formed above the n region 16 on the outer side of the trench 12, and a source region 20 which is the n+ region is formed above the p region 18. An upper part of the trench 12 is located closer to the inner side than the p region 18 and the source region 20.

In addition, in this example, on the lateral side of the source region 20 (the side far away from the trench 12), a conductive portion 22 having conductivity is formed which extends parallel to the trench 12 toward the inner side of the semiconductor substrate 10 and terminates in the p region 18. A p+ region 24 in which the lateral side and bottom are surrounded by the p region 18 is formed between the lower end of the conductive portion 22 and the p region 18, and the p region 18 is connected to the source (ground) by the p+ region 24. Alternatively, the conductive portion 22 may reach a boundary between the p region 18 and the n region 16, the p+ region 24 may be not surrounded by the p region 18, and a lower part of the p+ region 24 may be the n region 16.

The inside of the trench 12 is filled with an oxide insulating layer 30 that is formed from insulating SiO2, and the oxide insulating layer 30 reaches a position above the trench 12 and spreads with a predetermined thickness from there to a position above the source region 20. Regarding the oxide insulating layer 30, the oxide insulating layer 30 surrounding a gate region 32 is referred to as an oxide insulating layer 30a, and the oxide insulating layer 30 above the gate region 32 is referred to as an oxide insulating layer 30d.

The gate region 32 is disposed inside the oxide insulating layer 30 at the upper part inside the trench 12, and a shield gate region 34 is disposed inside the oxide insulating layer 30 at the lower part of the trench 12 below the gate region 32. The gate region 32 and the shield gate region 34 are formed by conductive polysilicon.

The oxide insulating layer 30 surrounding the gate region 32 and the shield gate region 34 is formed by, for example, thermal silicon oxide or silicon oxide of chemical vaper deposition (CVD).

Here, in the embodiment, on the outer side of the shield gate region 34 (on the lateral sides of the shield gate region 34 and below the shield gate region 34) inside the trench 12, there is an ONO structure in which a nitride insulating layer 40 having an insulation property is disposed inside the oxide insulating layer 30. That is, there is a structure in which an oxide insulating layer (SiO2) 30b, the nitride insulating layer (SiN) 40, and an oxide insulating layer (SiO2) 30c are positioned in this order from the outer side. Moreover, by adopting the ONO structure, there is no need to separately form a nitride insulating layer for preventing thermal oxidation, and the manufacturing process can be simplified.

In addition, an oxide insulating layer 30e which is relatively thick is disposed between the shield gate region 34 and the gate region 32. Because the oxide insulating layer 30e is located between the shield gate region 34 and the gate region 32 which are formed by polysilicon, the oxide insulating layer 30e is referred to as an inter-poly oxide insulating layer (IPO). Note that, in the specification, the oxide insulating layer 30e between the gate and the shield gate is referred to as an intermediate insulating layer.

In this shield gate type FET (n channel), when a positive voltage is applied to the gate region 32 in a state that a predetermined voltage is applied between the source region 20 and the drain region 14, a vertical channel is formed in the p region 18 surrounding the gate region 32 by a generated electric field, the source and the drain are conductive to each other, and a current flows therebetween. Moreover, the shield gate region 34 may be electrically connected to the gate region 32 or the source region 20.

The shield gate type FET has the shield gate region 34 in addition to the gate region 32. The shield gate region 34 is connected to the source, and thus when a voltage is applied between the drain and the source, a depletion layer spreads not only from the p region 18 but also from the side surface of the ONO structure 30b, and thereby the n region 16 between the trench 12 and the trench 12 can be quickly depleted. As a result, the capacitance between the gate and the drain can be reduced, and high-speed switching/switching loss can be reduced.

[Manufacturing Method]

Next, a method for manufacturing the field-effect transistor (shield gate type FET) according to the embodiment is described with reference to FIGS. 2A to 2D and FIGS. 3A to 3D.

Figure 2A:
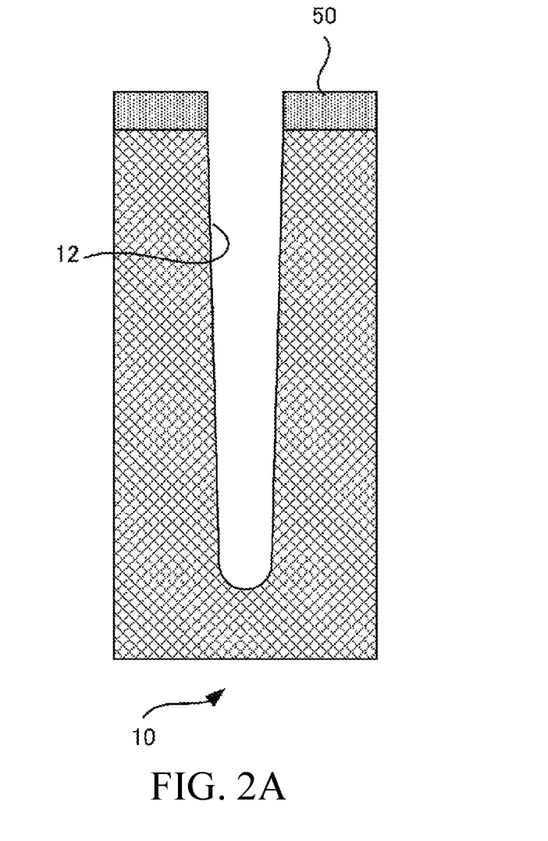
FIG. 2A is a diagram showing a method for manufacturing a shield gate type FET (the formation of a trench) according to the embodiment.

The trench 12 is formed as a vertical hole from the surface to the inside of the semiconductor substrate 10 by photolithography (processing including processes such as deposition, exposure, development, etching, and the like of a photoresist) (FIG. 2A).

That is, in the semiconductor substrate 10 having an oxide film 50 formed on the surface, the oxide film 50 is etched using a photoresist, the photoresist is removed, then the semiconductor substrate is etched (Si-etched) with the oxide film 50 serving as a mask, and the trench 12 is formed. In the drawing, the oxide film 50 remains on the surface of the semiconductor substrate 10 around the upper side of the trench 12.

Figure 2B:
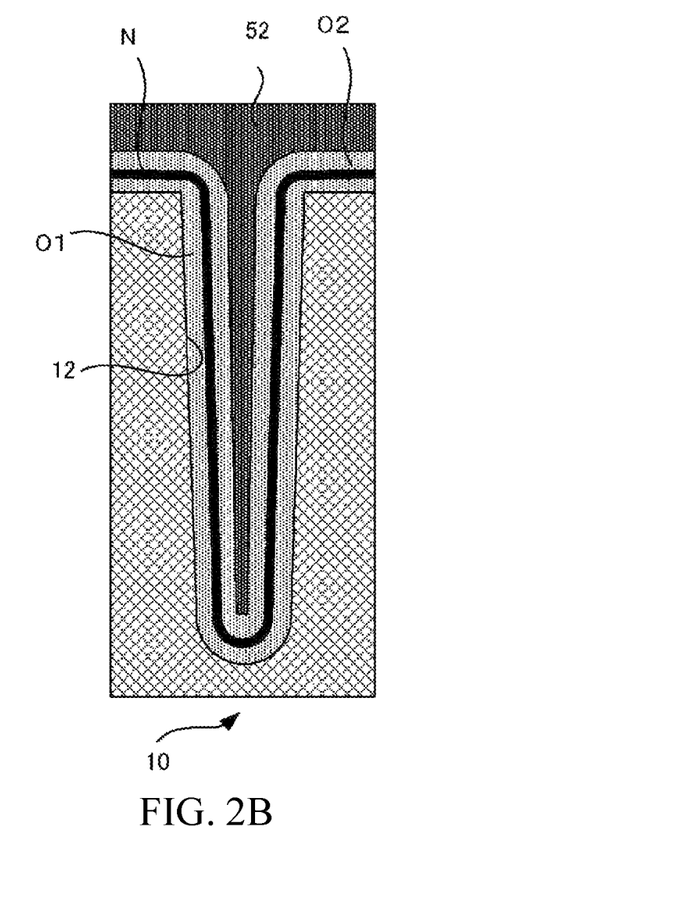
FIG. 2B is a diagram showing a method for manufacturing the shield gate type FET (the filling of polysilicon 52) according to the embodiment.

After the oxide film 50 is removed, a first oxide insulating layer ($SiO_2$) O1, a nitride insulating layer (SiN) N (40), and a second oxide insulating layer ($SiO_2$) O2 (30c) are formed in this order on the inner wall of the trench 12 and around an upper part of the trench 12, and polysilicon 52 is formed inside the trench 12 and at the upper part of the trench 12 (FIG. 2B). Note that, the oxide insulating layer O1 on the outer side is referred to as the first oxide insulating layer, is normally formed by thermal oxidation, and corresponds to the oxide insulating layer 30b in FIG. 1. Thereafter, an upper part of the nitride insulating layer N is removed, and the nitride insulating layer N in which the upper part has been removed becomes the nitride insulating layer 40 in FIG. 1. The second oxide insulating layer O2 is deposited by CVD or the like to become the oxide insulating layer 30c in FIG. 1.

Figure 2C:
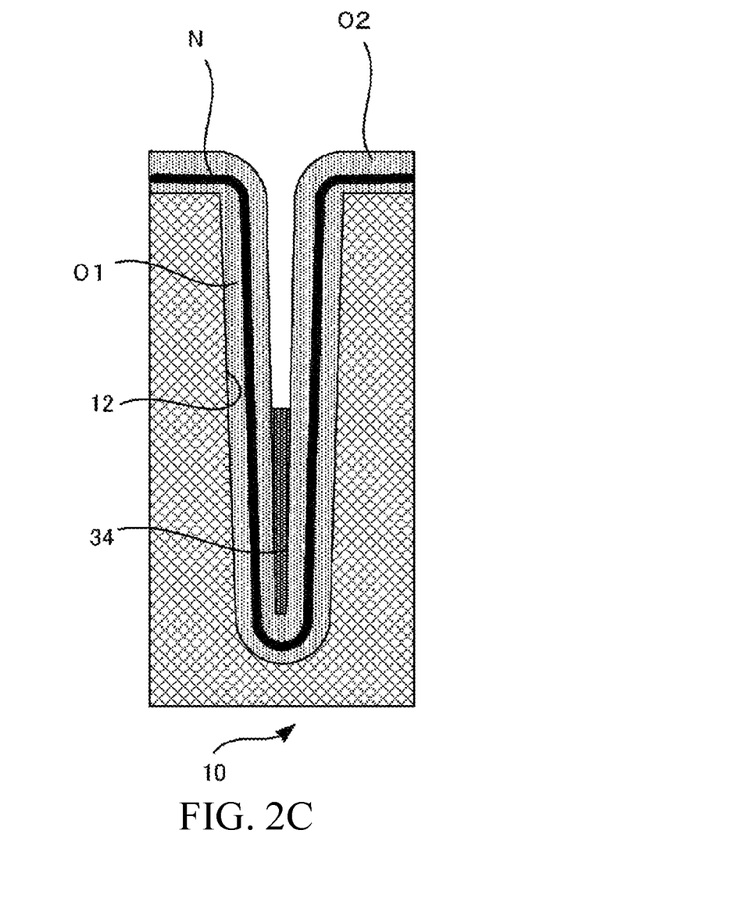
FIG. 2C is a diagram showing a method for manufacturing the shield gate type FET (the formation of a shield gate region 34) according to the embodiment.

Next, the polysilicon 52 is etched back to a predetermined height and shaped into a shape corresponding to the shield gate region 34 (FIG. 2C).

Figure 2D:
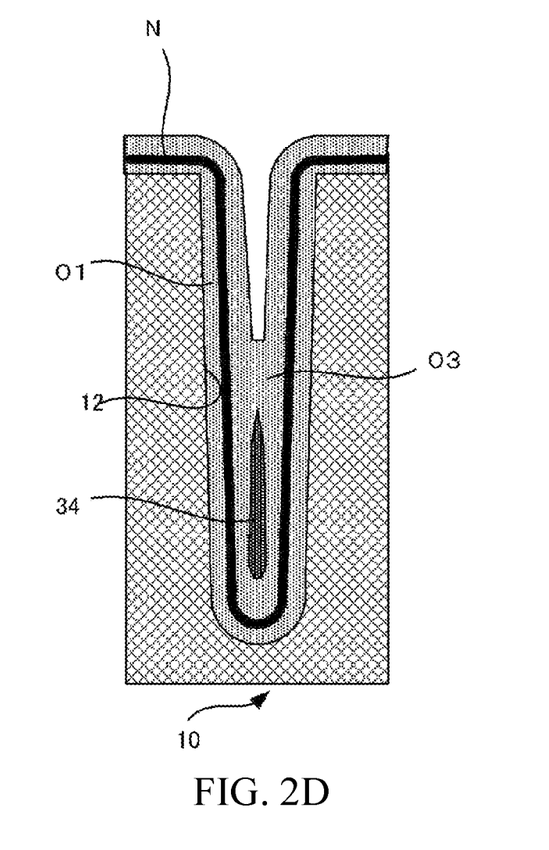
FIG. 2D is a diagram showing a method for manufacturing the shield gate type FET (the formation of an oxide insulating layer O3) according to the embodiment.

On the oxide insulating layer O2 above and at the upper side walls of the shield gate region 34, and above the shield gate region 34, an oxide insulating layer O3 which becomes an IPO (the oxide insulating layer 30e) is formed (FIG. 2D).

Figure 3A:
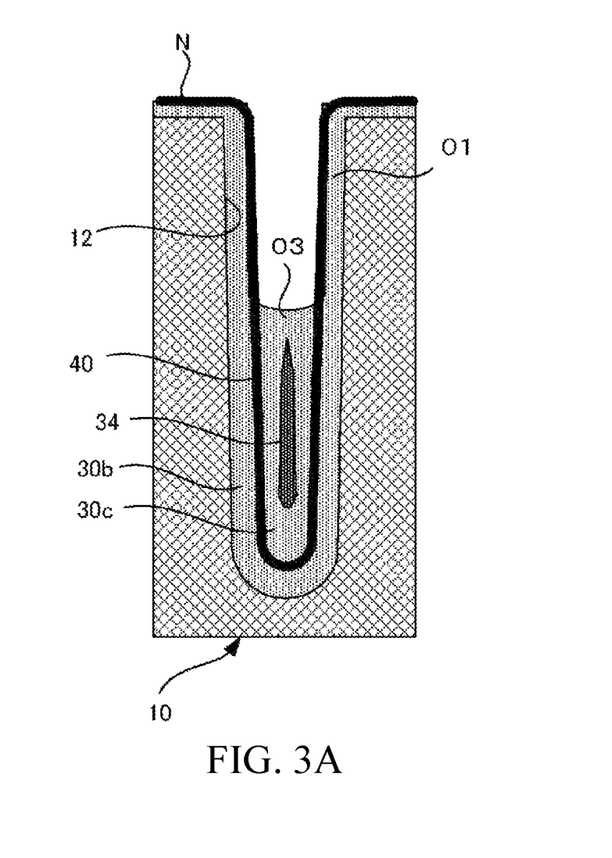
FIG. 3A is a diagram showing a method for manufacturing the shield gate type FET (the removal of an oxide insulating layer O1) according to the embodiment.

A predetermined amount of the oxide insulating layer O3 (30e) remains above the shield gate region 34, the oxide insulating layers O2 and O3 (the side walls) closer to the inner side than the nitride insulating layer 40 at the upper part inside the trench 12 are removed to expose the nitride insulating layer N thereof (FIG. 3A).

The nitride insulating layer N in the exposed part is removed by etching (FIG. 3B), and the remaining lower part of the nitride insulating layer N is taken as the nitride insulating layer 40. Here, because the removal of the nitride insulating layer N to be removed is reliably performed, the upper end of the remaining nitride insulating layer 40 is recessed with respect to the surface of the surrounding oxide insulating layer O3, and a recessed part 60 is formed.

Figure 3B:
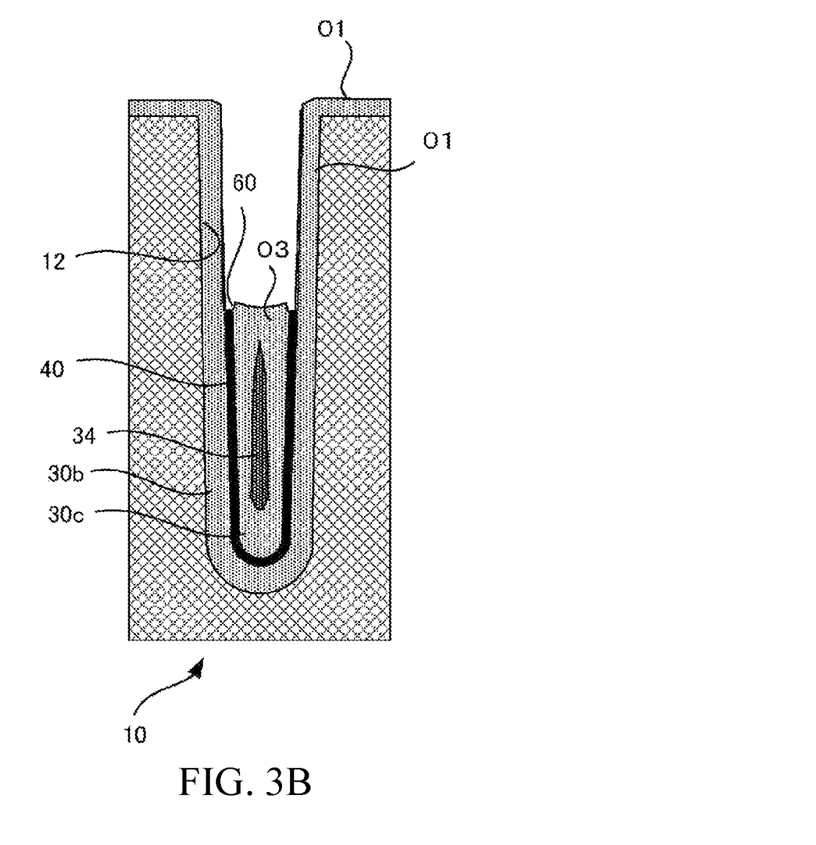
FIG. 3B is a diagram showing a method for manufacturing the shield gate type FET (the removal of a nitride insulating layer N) according to the embodiment.
Figure 3C:
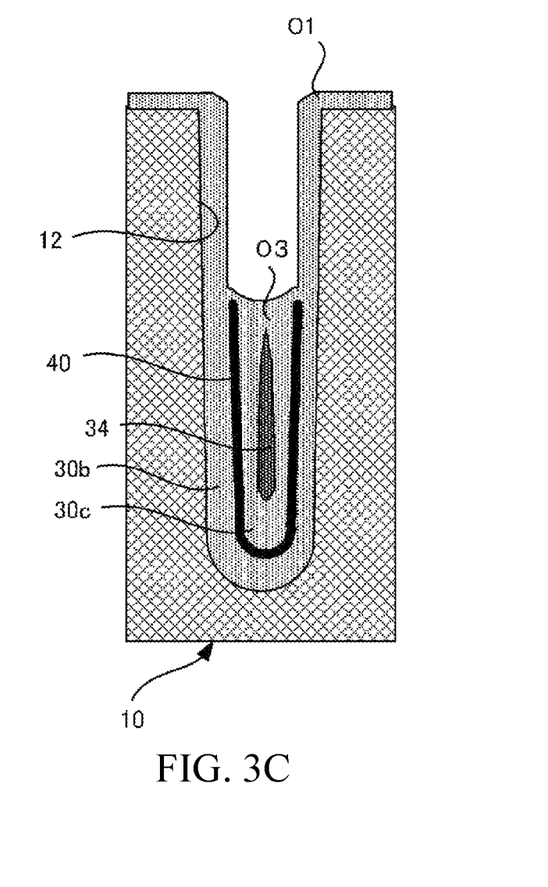
FIG. 3C is a diagram showing a method for manufacturing the shield gate type FET (the filling of a recessed part performed by CVD) according to the embodiment.

In order to make the oxide insulating layer 30a which becomes the side wall of a part forming the gate region 32 later have an appropriate thickness, the oxide insulating layer O3 is additionally deposited by CVD (FIG. 3C).

Figure 3D:
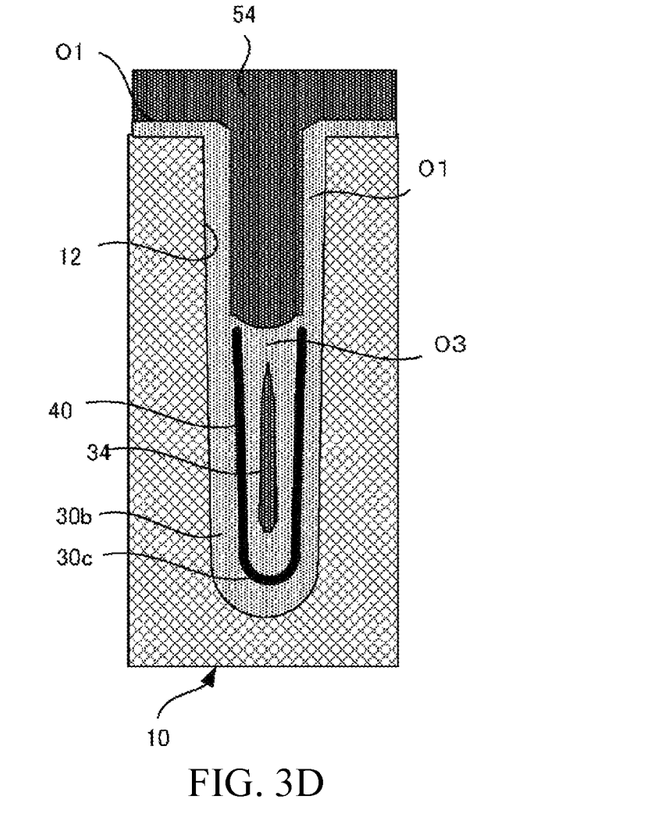
FIG. 3D is a diagram showing a method for manufacturing the shield gate type FET (the formation of polysilicon 54 for a gate region) according to the embodiment.

In the embodiment, the recessed part 60 generated due to the removal of the nitride insulating layer N is sufficiently filled at this time. The surface of the oxide insulating layer O3 becomes to have a convex shape. Then, polysilicon 54 for the gate region 32 is deposited (FIG. 3D).

Subsequently, the polysilicon 54 is etched back and shaped to have a predetermined size, the polysilicon 54 that has been etched back and shaped to have a predetermined size is taken as the gate region 32, and an oxide insulating layer is further deposited on the gate region 32. Thereafter, a source and the like are formed, and a shield gate trench type FET is formed.

[Removal of Nitride Insulating Layer]

Figure 4A:
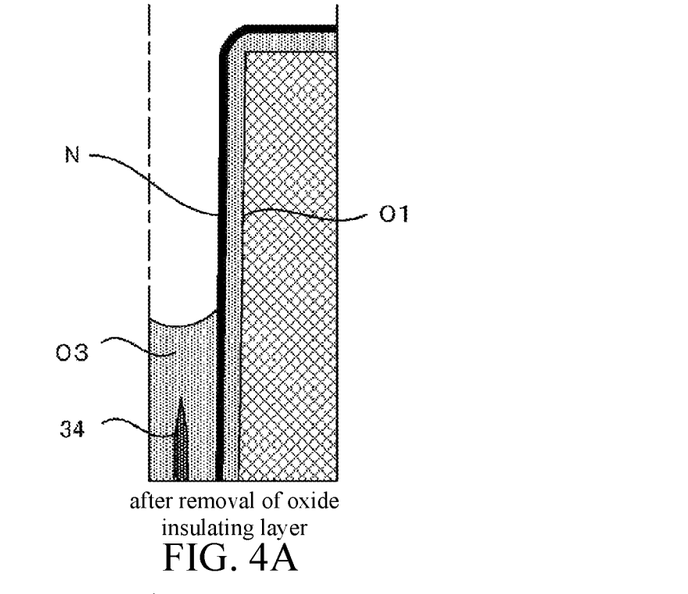
FIG. 4A is a diagram showing a method for manufacturing a shield gate type FET (the removal of the oxide insulating layer O1) in Comparative example.
Figure 4B:
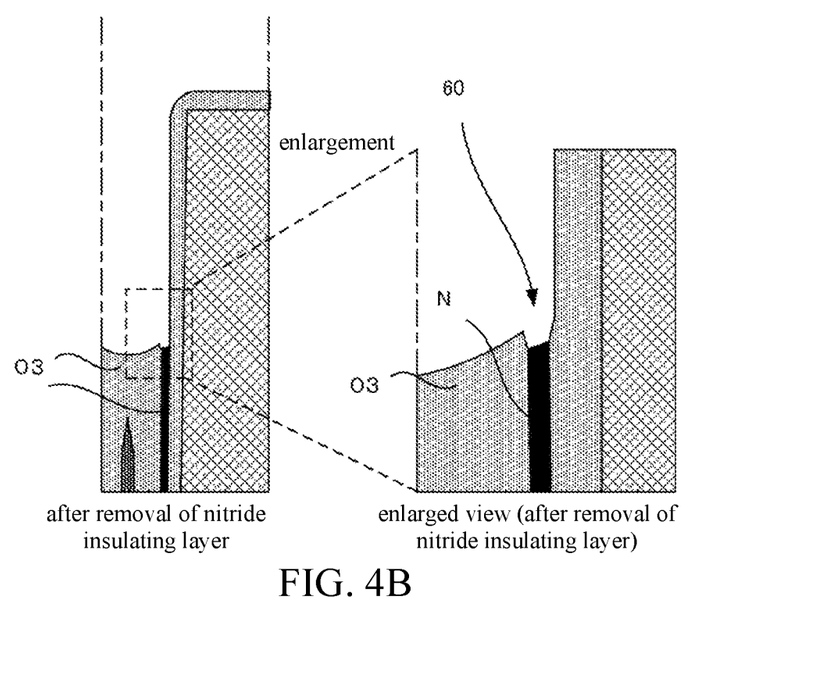
FIG. 4B is a diagram showing a method for manufacturing the shield gate type FET (the removal of the nitride insulating layer N) in Comparative example.
Figure 4C:
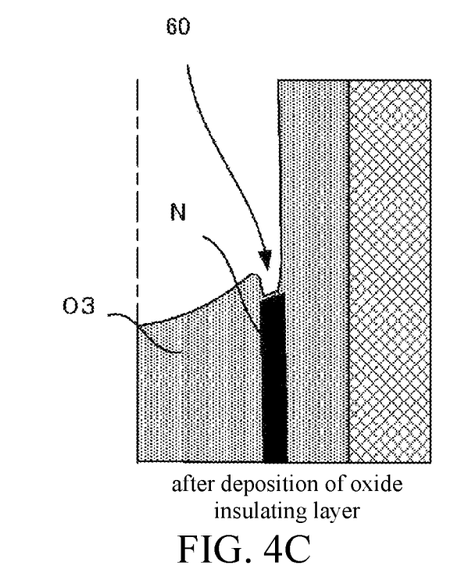
FIG. 4C is a diagram showing the filling of the recessed part in Comparative example.

FIGS. 4A to 4C show the state from the removal of the nitride insulating layer 40 to the subsequent formation of the oxide insulating layer O3 by the conventional method (Comparative example) here (corresponding to FIGS. 3A to 3C).

In this way, the recessed part 60, which is formed after the nitride insulating layer N is removed, cannot be sufficiently filled by the subsequent formation of an oxide insulating layer (referred to as a third oxide insulating layer) by CVD, and the recessed part remains.

That is, before the gate region 32 is formed, in order to form the gate region 32, the oxide insulating layer ($SiO2$) is etched, and then the nitride insulating layer N is etched. Accordingly, the recessed part 60 is formed on the upper end of the nitride insulating layer N. In the subsequent formation of the additional oxide insulating layer O3 by CVD, the layer thickness of the additional oxide insulating layer O3 is not thick enough to adjust the desirable gate oxide layer to have an appropriate thickness, and the recessed part 60 at the upper end of the nitride insulating layer N is not sufficiently filled. Therefore, when the gate region 32 is formed on the oxide insulating layer O3 (IPO) existing above the shield gate region 34, a downward protrusion part of the gate region 32 is generated on the nitride insulating layer 40.

When a voltage is applied to the gate region 32, the electric field is concentrated on the protrusion part of the gate region 32, and the leakage current increases.

Figure 5:
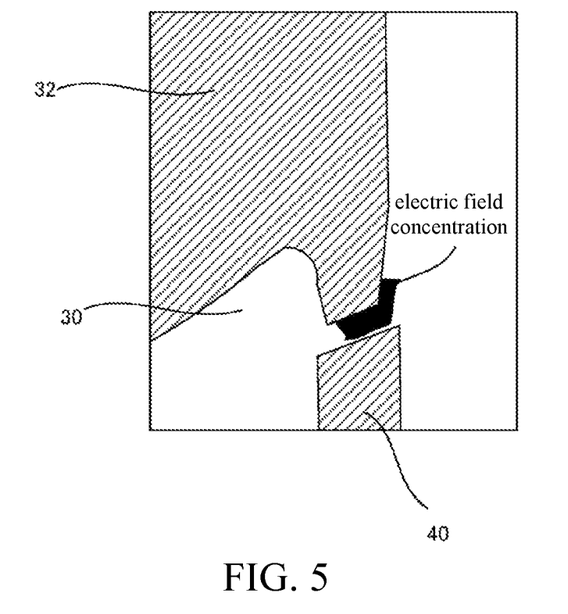
FIG. 5 is a diagram showing the concentration of an electric field in Comparative example.

FIG. 5 is a schematic diagram showing the electric field strength in a case in which the recessed part remains even when the oxide insulating layer 30 is additionally formed by CVD, and the black-painted part is a part having a great electric field strength. In this way, at a position where the oxide insulating layer 30 is thin and which faces the protrusion part of the gate region 32, a part having a great electric field strength is generated. Thus, a current is likely to flow to this part, and a leakage current between the gate and the source is likely to increase.

Figure 6A:
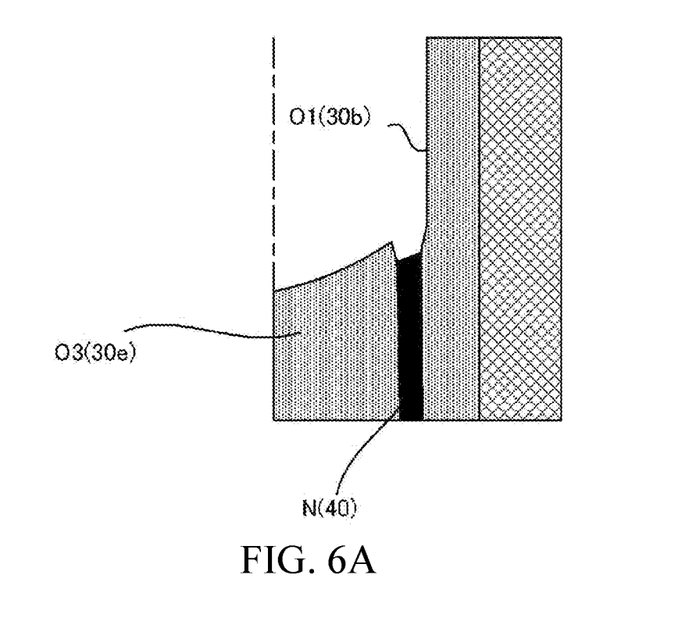
FIG. 6A is a diagram showing the removal of the nitride insulating layer N in the embodiment.
Figure 6B:
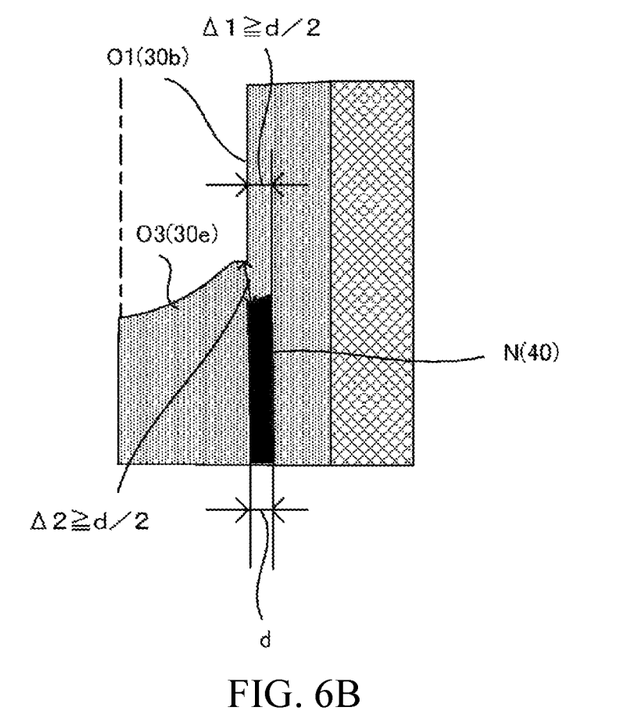
FIG. 6B is a diagram showing the filling of the recessed part in the embodiment.

FIGS. 6A and 6B show the state from the removal of the nitride insulating layer 40 to the subsequent formation of the oxide insulating layer according to the embodiment (corresponding to FIGS. 3A to 3C). In this way, by forming the oxide insulating layer thicker than a predetermined thickness by CVD, the recessed part generated along with the removal of the nitride insulating layer N (40) is backfilled, the surface thereof is made to have a convex shape, and the formation of the recessed part in the oxide insulating layer O3 is prevented.

In particular, as shown in FIG. 6B, a thickness Δ1 of the oxide insulating layer on the side wall is set to be ½ of a thickness d of the nitride insulating layer or more (Δ1≥d/2), and a thickness Δ2 of the oxide insulating layer O3 (30e) from the nitride insulating layer 40 to the gate region 32 is set to be ½ of the thickness d of the nitride insulating layer or more (Δ2≥d/2).

Figure 7:
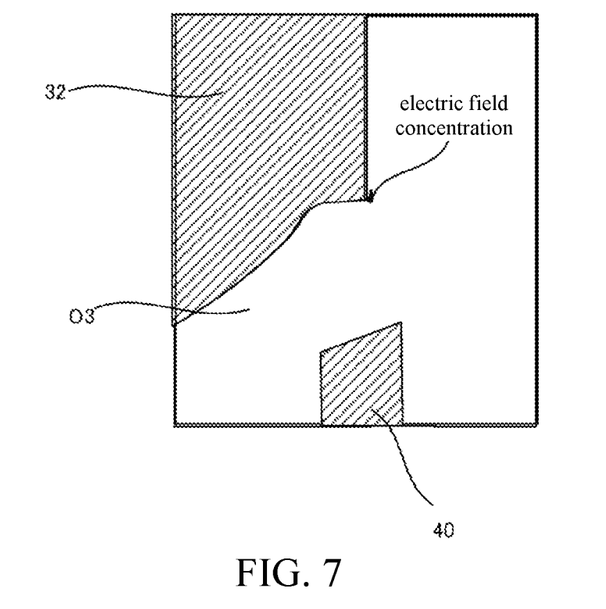
FIG. 7 is a diagram showing the concentration of the electric field in the embodiment.

Accordingly, the recess of the surrounding portion of the oxide insulating layer O3 (30e) is eliminated, and thus the protrusion part of the gate region 32 is also eliminated. As shown in FIG. 7, the concentration of the electric field can be avoided.

The width of the recessed part generated along with the removal of the nitride insulating layer 40 corresponds to the thickness d of the nitride insulating layer 40. The oxide insulating layer formed by CVD is deposited on the side walls and the surface of the bottom surface of the recessed part.

When an oxide insulating layer having a thickness of d/2 is deposited on the side walls, the recessed part is to be filled. Thus, when the condition of Δ1≥d/2 is satisfied, the recessed part is to be filled; and when the deposition on the bottom surface is added hereto, the oxide insulating layer which is enough to or more than enough to fill the recessed part is deposited.

When Δ2≥d/2 is satisfied, the concentration of the electric field can be reliably avoided.

Here, the concentration of the electric field can be avoided by satisfying either Δ1≥d/2 or Δ2≥d/2, but it is more effective when both Δ1≥d/2 and Δ2≥d/2 are satisfied.

Moreover, in order to maintain an appropriate thickness of the oxide insulating layer on the outer side of the gate region (outside the side walls of the gate region) inside the trench, it is preferable that the oxide insulating layer on the outer side of the nitride insulating layer is made relatively thin, and thus an appropriate thickness of the insulating layer on the lateral sides of the gate region is maintained even when a thick insulating layer is formed by CVD.

Figure 8:
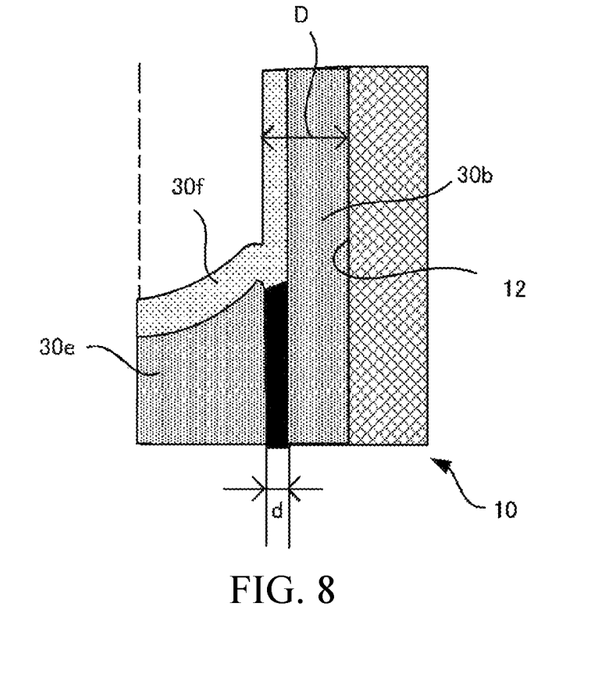
FIG. 8 is a diagram showing a state of an oxide insulating layer formed by CVD in the embodiment.

That is, as shown in FIG. 8, the oxide insulating layer 30b is formed by thermal oxidation at the inner wall of the trench 12. The thickness of the oxide insulating layer 30b is a distance from the inner wall of the trench 12 to the nitride insulating layer 40. An oxide insulating layer 30f of CVD is formed above the nitride insulating layer 40 and above the oxide insulating layer 30e on the inner side. In this example, the thickness of the oxide insulating layer 30b is made thinner than normal. Accordingly, even when the oxide insulating layer 30f formed by CVD is made relatively thick, a thickness D from the inner wall of the trench 12, including the oxide insulating layers 30b and 30f on the inner side, can be made to achieve a desired thickness.

Effect of Embodiment

According to the shield gate trench type FET according to the embodiment, the oxide insulating layer 30 surrounding the shield gate region 34 is made to have a three-layer structure of ONO (oxide insulating layer/nitride layer/oxide insulating layer), but the recessed part, which is generated along with the removal of the nitride insulating layer in the surrounding portion of the IPO, can be sufficiently filled with the oxide insulating layer formed by CVD. Thus, the generation of the protrusion part in the gate region can be prevented, and the generation of the leakage current can be effectively prevented.

REFERENCE SIGNS LIST

10: semiconductor substrate
12: trench
14: drain region
16: n region
18: p region
20: source region
22: conductive portion
24: p+ region
30: oxide insulating layer
32: gate region
34: shield gate region
40: nitride insulating layer

What is claimed is:

1. A field-effect transistor, comprising:
a trench, which is formed in a semiconductor substrate;
an oxide insulating layer, which is accommodated inside the trench, the oxide insulating layer having a surface with a convex shape;
a shield gate region, which is disposed at a lower part in the oxide insulating layer;
a gate region, which is disposed above the shield gate region in the oxide insulating layer with an interval therebetween, wherein the gate region has a bottom surface with a convex shape, and the surface of the oxide insulating layer with the convex shape matches the bottom surface of the gate region with the convex shape; and
a nitride insulating layer, which is disposed in a way of covering a bottom and a surrounding of a lateral side of the shield gate region in the oxide insulating layer with an interval therebetween;
wherein a thickness of the oxide insulating layer that is closer to an inner side than a line extending upward from an outer peripheral side of the nitride insulating layer is ½ of a thickness of the nitride insulating layer or more; or a thickness of the oxide insulating layer between an upper end of the nitride insulating layer and the gate region is ½ of a thickness of the nitride insulating layer or more.

2. The field-effect transistor according to claim 1, wherein the bottom surface of the gate region has a recessed part at a periphery thereof.

3. A field-effect transistor, comprising:
a trench, which is formed in a semiconductor substrate;
an oxide insulating layer, which is accommodated inside the trench;
a shield gate region, which is disposed at a lower part in the oxide insulating layer;
a gate region, which is disposed above the shield gate region in the oxide insulating layer with an interval therebetween, wherein the gate region has a bottom surface with a convex shape; and a nitride insulating layer, which is disposed in a way of covering a bottom and a surrounding of a lateral side of the shield gate region in the oxide insulating layer with an interval therebetween;

wherein a thickness of the oxide insulating layer between an upper end of the nitride insulating layer and the gate region is equal to or greater than a predetermined thickness, and a surface of the oxide insulating layer above an upper end of the nitride insulating layer has a convex shape, the surface of the oxide insulating layer with the convex shape matches the bottom surface of the gate region with the convex shape.

4. A method for manufacturing a field-effect transistor, comprising:

forming a trench in a semiconductor substrate;

depositing a first oxide insulating layer inside the trench;

depositing a nitride insulating layer on the first oxide insulating layer;

depositing a second oxide insulating layer on the nitride insulating layer;

forming a shield gate region on an inner side of the second oxide insulating layer and at a lower part inside the trench;

depositing an intermediate insulating layer above the shield gate region;

removing the second oxide insulating layer to expose the nitride insulating layer at an upper part inside the trench;

removing the nitride insulating layer at an upper part inside the trench, and generating a recessed part from a removal of the nitride insulating layer and forming the recessed part having a width corresponding to a thickness of the nitride insulating layer between the intermediate insulating layer and the first oxide insulating layer;

depositing a third oxide insulating layer on the first oxide insulating layer and the intermediate insulating layer that are exposed by removing the nitride insulating layer, and at this time, making a thickness with which the third oxide insulating layer is formed to be ½ of a thickness of the nitride insulating layer or more, thereby filling the recessed part and making a surface of the part of the third oxide insulating layer into a plane or have a convex shape that is convex upwards; and forming a gate region on an inner side of the first oxide insulating layer and at an upper part of the trench, wherein the gate region has a bottom surface with a convex shape, and the surface of the part of the third oxide insulating layer with the convex shape matches the bottom surface of the gate region with the convex shape.

* * * * *